(12) United States Patent
Vollrath et al.

(10) Patent No.: US 6,696,349 B2
(45) Date of Patent: Feb. 24, 2004

(54) STI LEAKAGE REDUCTION

(75) Inventors: Joerg Vollrath, Richmond, VA (US); Robert Petter, Berlin (DE)

(73) Assignee: Infineon Technologies Richmond LP, Sandston, VA (US)

( * ) Notice: Subject to any disclaimer, the term of this patent is extended or adjusted under 35 U.S.C. 154(b) by 37 days.

(21) Appl. No.: 10/054,452

(22) Filed: Nov. 13, 2001

(65) Prior Publication Data
US 2003/0089961 A1 May 15, 2003

(51) Int. Cl.[7] .............................................. H01L 21/76
(52) U.S. Cl. .................... 438/430; 438/431; 438/432; 438/437
(58) Field of Search ................................ 438/430, 431, 438/432, 477

(56) References Cited

U.S. PATENT DOCUMENTS

| 4,745,081 A | * | 5/1988 | Beyer et al. ................ 438/429 |
| 5,982,008 A | | 11/1999 | Kajiyama .................... 257/401 |
| 6,051,474 A | * | 4/2000 | Beasom ....................... 438/359 |
| 6,127,717 A | | 10/2000 | Krivokapic et al. ......... 257/505 |
| 6,130,140 A | * | 10/2000 | Gonzalez .................... 438/430 |
| 6,133,116 A | * | 10/2000 | Kim et al. ................... 438/430 |
| 6,175,140 B1 | | 1/2001 | Kajiyama .................... 257/401 |
| 6,306,724 B1 | * | 10/2001 | Chen ........................... 438/435 |
| 6,479,880 B1 | * | 11/2002 | Gonzalez .................... 257/508 |
| 2002/0137306 A1 | * | 9/2002 | Chen ........................... 438/430 |

* cited by examiner

Primary Examiner—George Eckert
Assistant Examiner—N. Drew Richards
(74) Attorney, Agent, or Firm—Lerner, David, Littenberg, Krumholz & Mentlik, LLP

(57) ABSTRACT

A semiconductor device is provided having at least two neighboring transistors and an STI region therebetween. The STI region is provided with a voltage bias to minimize subthreshold leakage current between the neighboring transistors. A method of fabricating such a semiconductor device is also provided.

13 Claims, 3 Drawing Sheets

STI LEAKAGE REDUCTION

BACKGROUND OF THE INVENTION

Semiconductor devices are employed in many types of equipment to perform a wide variety of applications. One important type of semiconductor device for use in the memory field is known as dynamic random access memory (DRAM), which is extensively used as memory components in computers. A basic DRAM cell may include a capacitor and a transistor. The capacitor stores a charge representing data. The transistor allows the data to be written to or read from the capacitor. By reducing the size of the transistor and capacitor, semiconductor manufacturers can fit more DRAM onto a chip. The increase in the amount of DRAM results in greater memory capacity for the chip.

An often-used transistor is the metal oxide semiconductor (MOS) field effect transistor, known as a MOSFET. The MOSFET has three regions, which are the source, gate and drain. Charge enters the MOSFET at the source, flows through a channel and exits at the drain. The gate controls operation of the transistor.

As DRAM chips are scaled down, the transistors are placed closer together. This makes it more difficult to prevent charge from leaking from one transistor into an adjacent transistor. For example, the undesirable leakage may occur between the drain of one transistor and the source of a neighboring transistor. The oxide isolation between the transistors creates a parasitic MOS device. The off current of the parasitic MOS device, known as subthreshold leakage, can be a problem. Subthreshold leakage can result in a discharge of the DRAM memory cell, effectively erasing the data that the cell is supposed to store.

Various methods have been developed to try and isolate neighboring transistors from each other in order to minimize subthreshold leakage. One widely used isolation method employs local oxidation of silicon (LOCOS). In LOCOS generally, a thick oxide is grown on the silicon substrate between two active devices. In attempting to reduce sub-threshold leakage, the LOCOS oxide is grown between neighboring transistors. First, a protective mask is placed over areas that should remain unchanged. Next, the chip is heated. Areas of silicon not protected by the mask are oxidized when the chip is heated. The oxide acts to electrically isolate the adjacent transistors, thereby reducing sub-threshold leakage. The LOCOS oxide is normally very thick, on the order of 500 nm.

One drawback to LOCOS isolation is the width of the oxide. LOCOS forms a "bird's beak" string on either side of the main oxide. The bird's beak encroaches on space where the transistors are formed. In order to avoid the bird's beak encroachment problem, transistors need to be spaced farther apart, which is undesirable for a high density DRAM chip.

A method that can be used as a substitute for LOCOS isolation in high-density DRAM chips is known as shallow trench isolation (STI). STI does not suffer from the scaling problem of LOCOS, which stems from the bird's beak encroachment problem.

In creating an STI region, a shallow trench is first etched into the silicon substrate between the transistors. A liner may be formed in the trench. The liner is typically an oxide or nitride. The liner provides a convenient interface between the substrate and the material added to fill the trench. Next, the trench is filled in with an oxide. It is possible to employ other materials instead of oxide to fill the trench. Finally, the oxide surface is polished so that the filled-in trench is in the same plane as the surface of the rest of the chip at that point in the fabrication process.

The present invention improves upon the isolation provided by previous STI techniques by providing improved subthreshold leakage reduction. Small amounts of charge can leak from one transistor to another through a region known as a parasitic region of a MOS device. This small amount of leakage may be enough to discharge the memory cell. The parasitic region has a threshold voltage. Subthreshold leakage occurs when the voltage in the parasitic region rises above the threshold voltage.

Normally, the threshold voltage of the parasitic region is kept well above the operating voltage of the transistors. For example, the supplied operating voltage of a densely packed DRAM chip is typically 3.3 volts. The threshold voltage of the parasitic region may be more than 15 volts. This threshold voltage still permits a leakage current on the order of 1 fA. In a densely packed DRAM chip, 1 fA is enough to discharge the memory cell. Therefore, there is a need for an improved isolation device that minimizes subthreshold leakage between transistors such that a memory cell is not discharged.

SUMMARY OF THE INVENTION

It is one aspect of the present invention to improve upon conventional STI devices. In the present invention, the trench of the STI device is filled with a conducting material. The conducting material should be chosen such that a voltage bias can be applied to it. In one preferred embodiment, the conducting material is polysilicon. A dopant is added to the polysilicon such that the polysilicon-filled STI trench can sustain a voltage bias. This voltage bias changes the threshold voltage of the parasitic region of the MOS device (i.e., the region in which leakage occurs between adjacent transistors), further reducing the subthreshold leakage between adjacent transistors.

It is another aspect of the present invention to minimize latch-up. Latch-up occurs in a commonly used MOS technology known as complementary MOS (CMOS). In CMOS, pairs of MOS transistors are associated with each other. One transistor is n-type (NMOS), where electrons carry the current. The other transistor is p-type (PMOS), where the current is carried by positively charged holes. The NMOS and PMOS transistors are complementary because only one transistor is active at a time.

Applying a positive voltage to the gates of the NMOS and PMOS transistors will activate the NMOS transistor while shutting off the PMOS transistor. Applying a negative voltage (or zero volts) to the gates of the PMOS and NMOS transistors turns on the PMOS transistor, while shutting off the NMOS transistor. Operating one transistor while keeping the other one off conserves power on the chip.

Latch-up is an event in which current flows through the substrate between NMOS and PMOS portions of CMOS circuitry. The parasitic regions on the CMOS device for the NMOS and PMOS portions create a 'latch' through which the current flows. Latch-up degrades the CMOS circuitry performance by causing a heavy static current that can destroy the circuitry. The present invention minimizes latch-up by suppressing the leakage current in each parasitic region.

It is yet another aspect of the present invention to enhance electrostatic discharge (ESD) immunity of circuitry. Electrostatic discharge occurs when a high voltage is applied to a contact, creating excessive electric fields that cause a high current flow to an adjacent region. The high current can melt the chip, thereby destroying it. The present invention enhances ESD immunity by suppressing high current flow between adjacent regions.

In accordance with one embodiment of the present invention, a semiconductor device is provided for minimizing subthreshold leakage. The semiconductor device comprises a semiconductor substrate, a plurality of transistors having a gate, a source and a drain formed in the semiconductor substrate, a shallow trench isolation (STI) region formed in the semiconductor substrate between two of the transistors, and an interconnect. The STI region includes a trench, a base layer arranged in a bottom portion of the trench, and conducting material arranged on top of the base layer in the trench. The interconnect provides a contact whereby a voltage bias can be applied to the conducting material such that the subthreshold leakage is minimized.

In accordance with another embodiment of the invention, the semiconductor device further includes a plurality of capacitors. The capacitors are electrically connected to the transistors, forming DRAM memory cells. The voltage bias alters the threshold voltage such that subthreshold leakage current is too low to discharge the capacitor of the memory cell.

In accordance with yet another embodiment, the conducting material chosen is polysilicon. In accordance with yet another embodiment, the conducting material of the STI region is doped with p-type material. In accordance with yet another embodiment, the conducting material of the STI region is doped with n-type material. The p-type and n-type materials enhance the ability of the conducting material to sustain a voltage bias.

The base layer may be formed of different materials. In one example, the base layer is an oxide layer. In another example, the base layer is a nitride layer. In yet another example, the base layer is an oxide-nitride-oxide layer.

In accordance with yet another embodiment, the semiconductor device further comprises a top layer. The top layer is formed on top of the conducting material. The top layer has an open region, which permits the interconnect to contact the conducting layer. In one example, the top layer is an oxide layer. In another example, the top layer is a nitride layer. In yet another example, the top layer is an oxide-nitride-oxide layer.

In yet another embodiment of the present invention, semiconductor circuitry having reduced subthreshold leakage is formed. The circuitry includes a plurality of transistors and an STI device for isolating the plurality of transistors from one another. The STI device includes shallow trench, a base layer formed in the trench, and a polysilicon conducting layer formed on the base layer. The polysilicon conducting layer includes a dopant that permits the STI device to sustain a voltage bias.

The doped polysilicon can be biased at different voltage levels depending upon the kinds of semiconductor circuits the STI separates. In one example, when the STI separates one n-type FET (NFET) from another NFET, the doped polysilicon is biased below about a ground voltage of zero volts. In another example, when the STI separates one p-type FET (PFET) from another PFET, the doped polysilicon is biased above about a supply voltage.

In accordance with another embodiment of the present invention, a method of fabricating a semiconductor device is provided. The method includes forming first and second transistors on a semiconductor substrate, forming an STI region including a shallow trench in the semiconductor substrate between the first and second transistors, forming a base layer on a bottom portion of the shallow trench, filling the shallow trench with conducting material over the base layer, and forming an interconnect at the STI region whereby a voltage bias can later be applied thereto such that subthreshold leakage between the first and second transistors is minimized. The order of forming the transistors and the STI region does not matter. For example, the transistors may be formed before, during or after the STI region is formed.

In yet another embodiment of the present invention, first and second capacitors are formed. The first capacitor is electrically connected to the first transistor, creating a DRAM memory cell. The second capacitor is electrically connected to the second transistor, creating a DRAM memory cell. The capacitors may be formed before, during or after the transistors and/or the STI region.

In another embodiment of the method of fabricating a semiconductor device, the conducting material is polysilicon doped with p-type material. In another embodiment, the conducting material is polysilicon doped with n-type material. The conducting material can be doped before, during or after the conducting material is formed in the shallow trench.

The base layer may comprise a variety of materials. In one example, the base layer is selected from the group consisting of an oxide layer, a nitride layer and an oxide-nitride-oxide layer.

In yet another embodiment of the method of fabricating, a top layer is formed on the conducting material. The top layer may have an open area. The open area may be created after the top layer is formed on the conducting material or it may be created while the top layer is formed on the conducting material. The top layer may comprise a variety of materials. In one example, the top layer is selected from the group consisting of an oxide layer, a nitride layer and an oxide-nitride-oxide layer. In another embodiment, the conducting material is recessed below a top region of the trench prior to forming the top layer. In the embodiment where the top layer has an open area, a conducting interconnect may be arranged therein in contact with the conducting material.

The semiconductor device of the present invention and the method of fabricating a semiconductor device of the present invention provide enhanced isolation between active devices such as transistors. The STI device allows transistors to be made smaller, thereby increasing the amount of DRAM that fit on a chip, while at the same time reducing subthreshold leakage.

DETAILED DESCRIPTION

Figure 1:
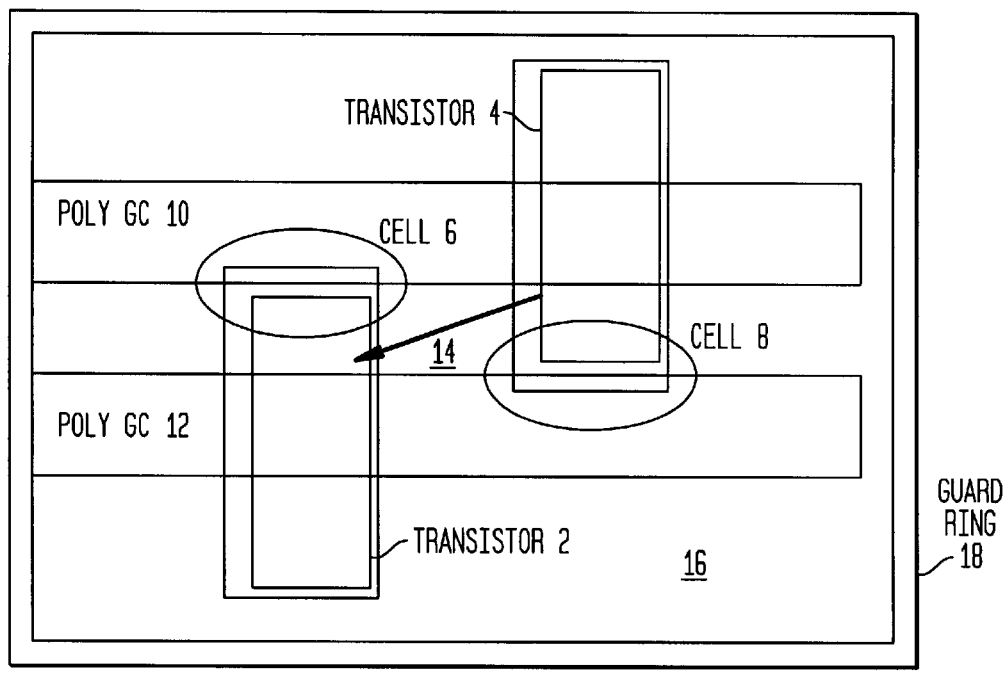
FIG. 1 is a schematic top plan view of a pair of transistors on a substrate isolated by a voltage-biased STI in accordance with the present invention.

In accordance with a preferred embodiment of the present invention, a semiconductor device is formed with a shallow trench in a substrate, a base layer in a bottom region of the trench, conducting material over the base layer filling the shallow trench, and an interconnect on top of the conducting material. The conducting material is chosen such that it can sustain a voltage bias. Preferably, the conducting material is polysilicon. Various dopants can be added to the conducting material to enhance its ability to sustain the voltage bias. For instance, a non-exhaustive list of possible dopants includes phosphorous, arsenic and boron.

The voltage bias is applied to the conducting material through the interconnect. The voltage bias acts to increase the threshold voltage for a parasitic region that may form between two transistors separated by the semiconductor device. Without the semiconductor device of the present invention, leakage current may flow between the source of one transistor to the drain of the other transistor through the parasitic region. The increased threshold voltage of the parasitic region minimizes any leakage current between the two transistors.

Different dopants may be used for NFETs and PFETs. For example, when isolating two NFET transistors, an n-type dopant is added to the conducting material. When isolating two PFET transistors, a p-type dopant is added to the conducting material. Changing the dopant concentration allows the manufacturer more control over how much voltage bias can be applied to the STI device. The doping concentration may vary through a wide range. Preferably, the concentration is within the range of approximately $10^{15}$ to $10^{20}$ parts per cubic centimeter.

The base layer acts as an insulator between the conducting material and the semiconductor substrate. Different materials can act as the base layer. For example, the base layer can be an oxide, a nitride, or a sandwich of oxide, nitride and oxide (ONO). While the shallow trench depth is on the order of 0.2 $\mu$m, the base layer can be made very thin. For example, the base layer may be on the order of 10 or 20 nm in thickness. One skilled in the art will appreciate that this range is approximate. The thin base layer would normally reduce the threshold voltage of the parasitic region. However, voltage biasing the conducting layer corrects for this reduction.

Importantly, because the voltage bias can be chosen by the manufacturer, it allows the manufacturer to have precise control over the leakage current. The leakage current can be reduced by a factor from 10 to 100 or more. For example, if the leakage current would normally be 1 fA, applying a 100 mV bias to the conducting material would result in a reduced leakage current of 0.1 fA. The voltage bias is chosen such that the reduced leakage current would not discharge the memory cell.

In addition to the base layer and the conducting material, the STI device may also include a top layer. The top layer can afford further protection for the conducting material. As with the base layer, the top layer may be made from various materials, such as oxide, nitride or ONO. The top layer can be as thin as 2 to 3 nm, or as thick as desired. The relative thickness of the conducting material, the bottom layer and the top layer are adjustable so long as the combination comes up to the top of the trench at that point in the fabrication process.

Various embodiments of the present invention will now be explained with reference to the figures. FIG. 1 schematically illustrates a top plan view 1 of a pair of transistors 2 and 4 in a substrate. Capacitors (not show) are electrically connected to transistors 2 and 4 to form memory cells 6 and 8. The transistors are surrounded by semiconductor device 16 of the present invention. Memory cell 6 is controlled through gate control line 10. Memory cell 8 is controlled through gate control line 12. Arrow 14 shows how leakage current flows from the source of transistor 4 to the drain of transistor 2.

As noted above, a typical leakage current of 1 fA between transistors 2 and 4 would be enough to discharge the memory cell at a higher voltage potential. However, semiconductor device 16 increases the threshold voltage, which reduces the leakage current such that the memory cells are unaffected. Guard ring 18 surrounds transistors 2 and 4, memory cells 6 and 8, and semiconductor device 16. The guard ring is an active area providing electrical contact to the substrate. Guard ring 18 acts to isolate an NMOS region from a PMOS region on the substrate in order to minimize latch-up.

Figure 2:
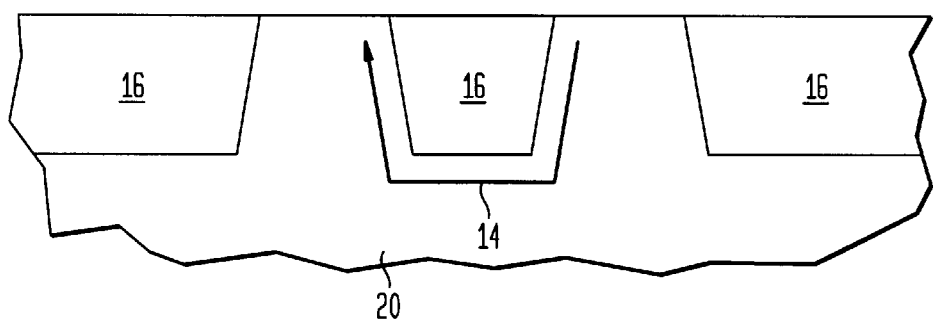
FIG. 2 is a schematic cross-sectional view of the pair of transistors isolated by the voltage-biased STI shown in FIG. 1.

FIG. 2 schematically illustrates a cross-sectional view 20 of semiconductor device 16 of FIG. 1. Semiconductor device 16 of the present invention is in between and on both sides of transistors 2 and 4 and memory cells 6 and 8 (not shown). Leakage current, as depicted by arrow 14, flows under the portion of semiconductor device 16 between transistors 2 and 4. As explained above, this leakage current is reduced to a level that renders it harmless to the memory cells.

FIGS. 3–7 schematically illustrate the progress in fabricating a semiconductor device according to one embodiment of the invention. In particular, FIGS. 3–7 illustrate how to create a voltage-biased semiconductor device of the present invention. The steps are presented in logical order, but this order is not intended to limit how the semiconductor device is formed in practice. Some steps that are shown separately may be performed at the same time.

Figure 3:
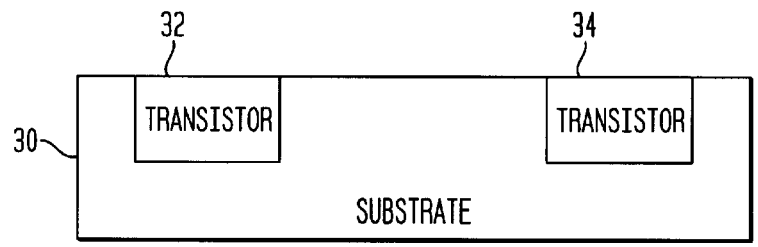
FIG. 3 is a schematic cross-sectional view illustrating a semiconductor substrate having a pair of transistors therein at a step in the present process of fabricating a semiconductor device.
Figure 4:
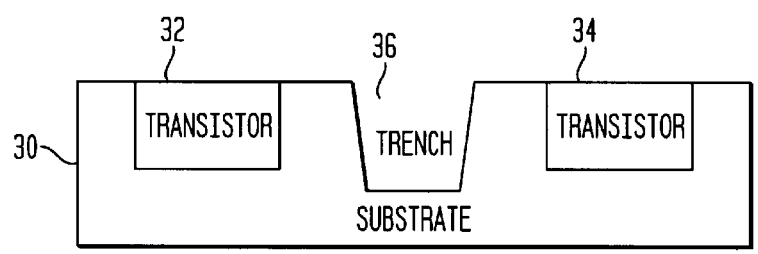
FIG. 4 is a schematic cross-sectional view illustrating the result of another step in the process of forming a semiconductor device of the present invention.

FIG. 3 is a schematic cross-sectional view of a substrate 30 having first transistor 32 and second transistor 34. FIG. 4 is a schematic cross-sectional view of trench 36 after it is formed in substrate 30 between transistors 32 and 34. Trench 36 may be formed by various means. For example, trench 36 may be etched via reactive ion etching (RIE). Whichever method used should create a trench having substantially vertical sidewalls. Note that while trench 36 is shown in FIG. 4 as being formed between transistors 32 and 34, the trench will be formed so as to surround the transistors as shown in FIGS. 1 and 2.

Figure 5:
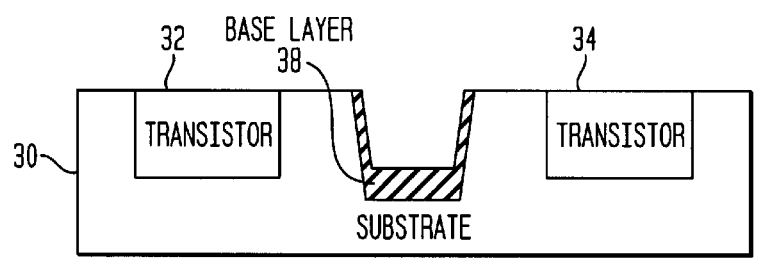
FIG. 5 is a schematic cross-sectional view illustrating the result of yet another step in the process of forming a semiconductor device of the present invention.

Next, FIG. 5 illustrates trench 36 after base layer 38 is formed at the bottom. FIG. 5 illustrates that base layer 38 may initially be formed along the bottom and sides of the trench. The portion of base layer 38 that is adjacent to the sides of the trench is removed so that a conducting material can form in the trench. Base layer 38 may be formed by various means. For example, if base layer 38 is an oxide, it may be grown in trench 36. One growth technique is to expose the bottom of the trench to dry oxygen. Another growth technique is to expose the bottom of the trench to a combination of H₂ and O₂ gases. Yet another oxide growth technique is plasma oxidation. Other methods of forming an oxide base layer will be evident to those skilled in the art.

Figure 6:
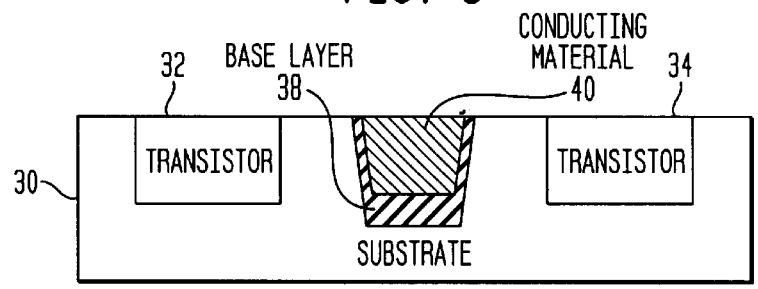
FIG. 6 is a schematic cross-sectional view illustrating the result of yet another step in the process of forming a semiconductor device of the present invention.

FIG. 6 illustrates trench 36 after conducting material 40 is formed on top of base layer 38. Conducting material 40 may be formed by various techniques. For example, conducting material 40 may be deposited. One preferable method of deposition is chemical vapor deposition (CVD). In CVD, gaseous reactants are provided near the portion of the substrate where deposition is desired. By choosing an appropriate temperature and pressure, the gaseous reactants will deposit a solid material on the desired portion of the substrate.

Once conducting material 40 is formed on base layer 38, it may be polished or smoothed by various means, resulting in a flat or planarized surface (not shown). One preferred method of planarizing the surface is chemical-mechanical polishing (CMP). Planarization is preferred because it provides a smooth surface should other materials be placed on the conducting layer.

The dopant (not shown) may be added to conducting material 40 either during or after conducting material 40 is formed in trench 36. For example, the dopant may be mixed in as a gas during CVD. Alternatively, the dopant may be diffused into conducting material 40 after deposition. Different dopants may be employed depending upon whether the STI device is formed in an n-type or a p-type substrate. The dopant concentration may be varied depending upon voltage bias desired.

Figure 7:
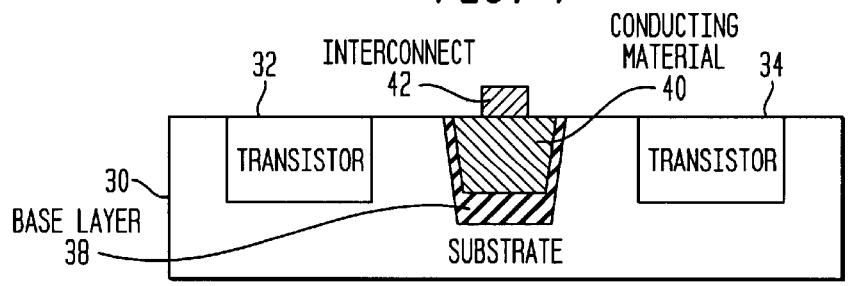
FIG. 7 is a schematic cross-sectional view illustrating the result of yet another step in the process of forming a semiconductor device of the present invention.

FIG. 7 illustrates the semiconductor device after interconnect 42 is formed on top of conducting material 40. Interconnect 42 provides a contact such that the voltage bias can be applied to the conducting material of the semiconductor device. Interconnect 42 may be formed by any of the means explained above.

Figure 8:
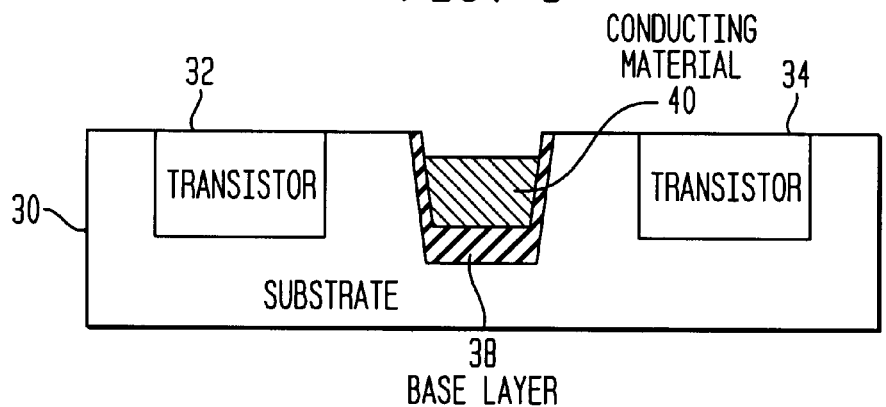
FIG. 8 is a schematic cross-sectional view illustrating the result of a step in an alternative process of forming a semiconductor device of the present invention.
Figure 9:
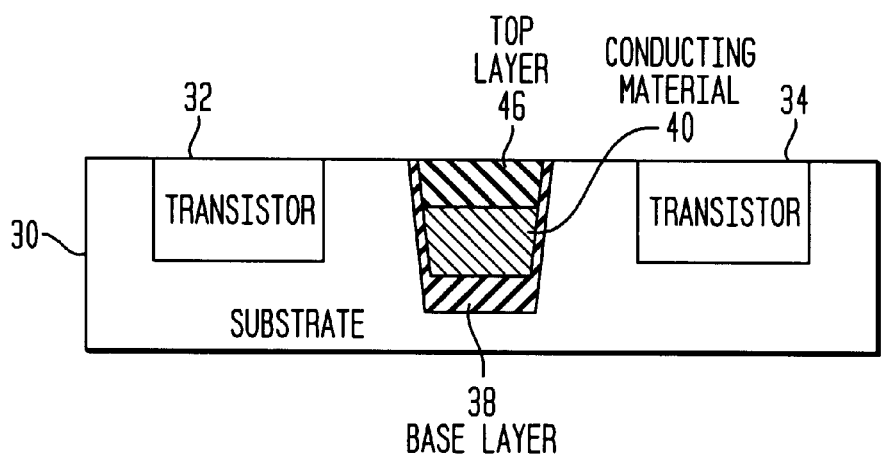
FIG. 9 is a schematic cross-sectional view illustrating the result of another step in the alternative process of forming a semiconductor device of the present invention.
Figure 10:
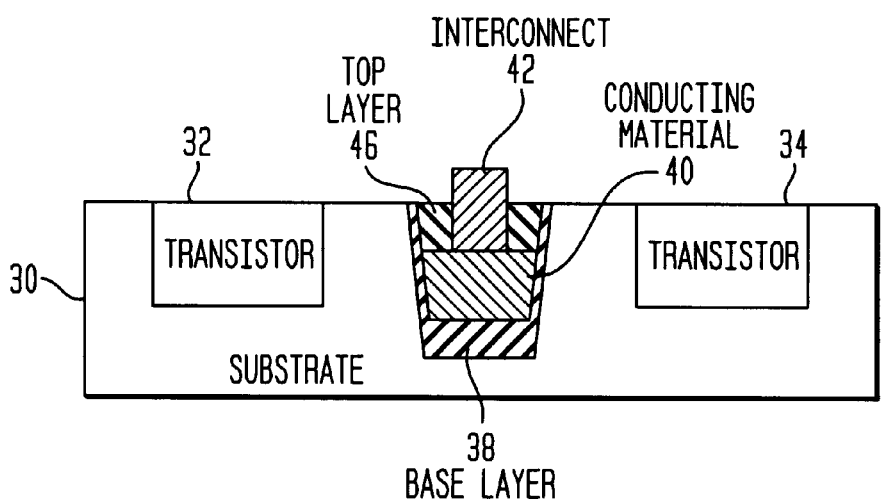
FIG. 10 is a schematic cross-sectional view illustrating the result of yet another step in the alternative process of forming a semiconductor device of the present invention.

FIGS. 8–10 schematically illustrate the progress in fabricating another semiconductor device according to the present invention. The steps presented in FIGS. 8–10 are additional process steps that occur after the steps previously shown in FIGS. 3–6. FIG. 8 illustrates the semiconductor device from FIG. 6 after the conducting material has been recessed. The recessed surface of conducting material 40 is at a height below that of the surface of substrate 60. Recessing can be performed in several ways, for example by RIE. Instead of recessing, it is possible to form the conducting material initially without filling up to the top of the trench.

FIG. 9 shows the semiconductor device after top layer 46 has been formed on top of conducting material 40. The top layer may comprise one of several compositions. One preferable composition is an oxide layer that may be formed on conducting material 40. Another preferable composition is a nitride layer that may be formed on conducting material 40. Yet another preferable composition is an oxide-nitride-oxide layer that may be formed on conducting material 40.

Finally, FIG. 10 illustrates the semiconductor device after interconnect 42 has been formed. Interconnect 42 provides a contact such that a voltage bias can be applied to the conducting material of the STI device. Interconnect 42 contacts conducting material 40 through a gap in top layer 46. The gap may be created during formation of top layer 46. For example, a mask can be placed over a portion of the trench such that the top layer is not formed where the mask is placed. Alternatively, a portion of top layer 46 may be etched to provide the gap.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. A method of fabricating a semiconductor device, comprising:
   (a) forming first and second transistors on a semiconductor substrate;
   (b) forming a STI region including a shallow trench in the semiconductor substrate between the first and second transistors, said shallow trench having a top region adjoining a main horizontal surface of said semiconductor substrate;
   (c) partially filling the shallow trench with conducting material to a level below said top region; and
   (d) forming an interconnect at the STI region whereby a voltage bias can later be applied thereto such that subthreshold leakage between the first and second transistors is minimized.

2. The method of claim 1, further comprising forming first and second capacitors, whereby the first capacitor is electrically connected to the first transistor and the second capacitor is electrically connected to the second transistor.

3. The method of claim 1, wherein the conducting material is polysilicon, said method further comprising doping the polysilicon with a p-type dopant.

4. The method of claim 1, wherein the conducting material is polysilicon, said method further comprising doping the polysilicon with an n-type dopant.

5. The method of claim 1, further comprising forming a top layer on the conducting material prior to forming the interconnect.

6. The method of claim 5, further comprising creating an open region in the top layer and arranging the interconnect in contact with the conducting material.

7. The method of claim 5, wherein the top layer is selected from the group consisting of an oxide layer, a nitride layer and an oxide-nitride-oxide layer.

8. The method of claim 1, further comprising forming a base layer in the shallow trench prior to filling the shallow trench with conducting material.

9. The method of claim 8, wherein the base layer is selected from the group consisting of an oxide layer, a nitride layer and an oxide-nitride-oxide layer.

10. The method of claim 5 wherein a gap is formed in the top layer by covering a portion of the conducting material within the trench with a mask prior to forming the top layer and thereafter removing the mask, wherein the interconnect is formed through the gap.

11. The method of claim 5 wherein the top layer includes an oxide-nitride-oxide layer.

12. The method of claim 8 wherein the base layer includes a nitride layer.

13. The method of claim 8 wherein the base layer includes an oxide-nitride-oxide layer.

* * * * *